United States Patent
Kaya et al.

(10) Patent No.: US 9,356,093 B2
(45) Date of Patent: May 31, 2016

(54) SEMICONDUCTOR DEVICE

(71) Applicant: Renesas Electronics Corporation, Kawasaki-shi, Kanagawa (JP)

(72) Inventors: Yoshinori Kaya, Kanagawa (JP); Yasushi Nakahara, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/711,754

(22) Filed: May 13, 2015

(65) Prior Publication Data

US 2015/0243731 A1    Aug. 27, 2015

Related U.S. Application Data

(63) Continuation of application No. 14/085,942, filed on Nov. 21, 2013, now Pat. No. 9,054,070.

(30) Foreign Application Priority Data

Dec. 13, 2012  (JP) ................................. 2012-272859

(51) Int. Cl.
| | |
|---|---|
| *H01L 29/06* | (2006.01) |
| *H01L 29/40* | (2006.01) |
| *H01L 29/78* | (2006.01) |
| *H01L 21/761* | (2006.01) |
| *H01L 27/02* | (2006.01) |
| *H01L 29/423* | (2006.01) |
| *H01L 29/08* | (2006.01) |
| *H01L 21/8234* | (2006.01) |

(52) U.S. Cl.
CPC .......... *H01L 29/0642* (2013.01); *H01L 21/761* (2013.01); *H01L 27/0207* (2013.01); *H01L 29/0653* (2013.01); *H01L 29/402* (2013.01); *H01L 29/404* (2013.01); *H01L 29/7816* (2013.01); *H01L 21/823481* (2013.01); *H01L 29/0878* (2013.01); *H01L 29/42368* (2013.01)

(58) Field of Classification Search
CPC .............. H01L 29/404; H01L 29/7816; H01L 29/0653; H01L 29/402; H01L 29/0623
USPC .......... 438/140, 454; 257/367, 409, 500, 501, 257/E29.009, 127, 484, E29.012, E29.013
See application file for complete search history.

(56) References Cited

U.S. PATENT DOCUMENTS

| 8,093,923 B2 * | 1/2012 | Shimizu .............. H01L 27/0629 257/501 |
| 2004/0262678 A1 * | 12/2004 | Nakazawa .......... H01L 29/0619 257/330 |

(Continued)

FOREIGN PATENT DOCUMENTS

| JP | 2007-005823 A | 1/2007 |
| JP | 2010-147181 A | 7/2010 |

*Primary Examiner* — Victor A Mandala
(74) *Attorney, Agent, or Firm* — Shapiro, Gabor and Rosenberger, PLLC

(57) ABSTRACT

An isolation region includes an element isolation film and a field plate electrode. The field plate electrode overlaps the element isolation film and surrounds a first circuit when seen in a plan view. A part of the field plate electrode is also positioned on a connection transistor. A source and a drain of the connection transistor are opposite to each other through the field plate electrode when seen in a plan view. In addition, the field plate electrode is divided into a first portion including a portion that is positioned on the connection transistor, and a second portion other than the first portion.

8 Claims, 9 Drawing Sheets

(56) References Cited

U.S. PATENT DOCUMENTS

| | | | |
|---|---|---|---|
| 2007/0013022 A1* | 1/2007 | Shimizu | H01L 21/84 257/500 |
| 2010/0314710 A1* | 12/2010 | Yamaji | H01L 24/05 257/501 |
| 2011/0133269 A1* | 6/2011 | Yamaji | H01L 27/1203 257/328 |
| 2013/0037852 A1* | 2/2013 | Tamaki | H01L 29/7811 257/139 |
| 2014/0151785 A1* | 6/2014 | Akagi | H01L 29/7802 257/329 |

* cited by examiner

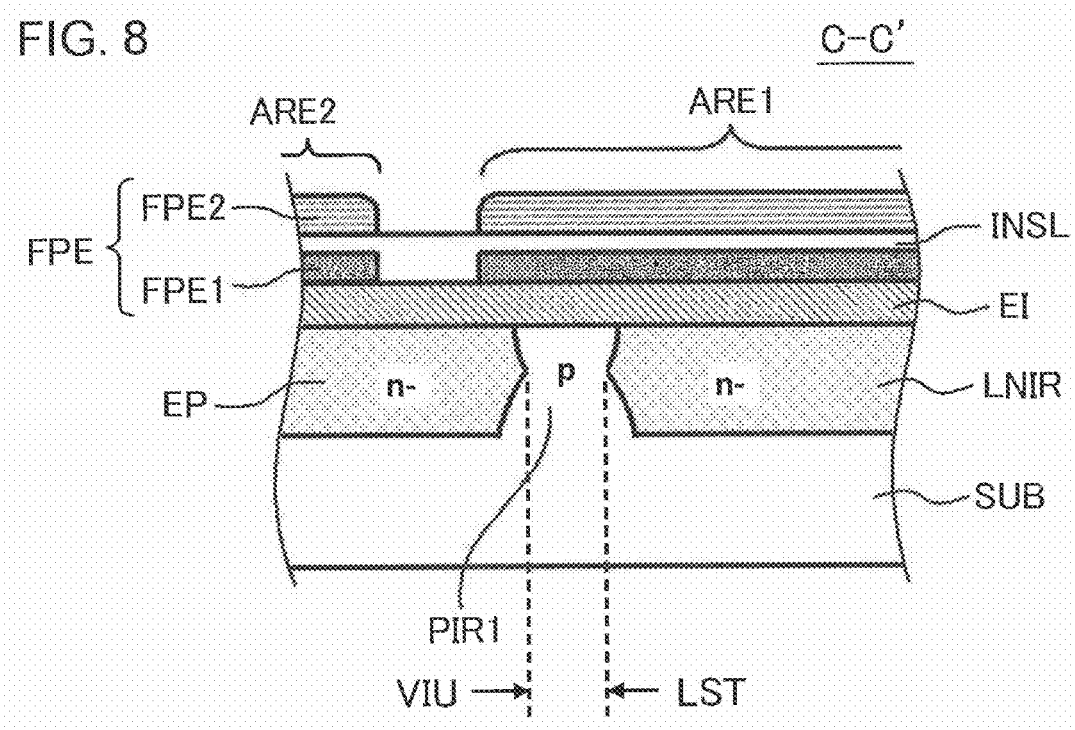

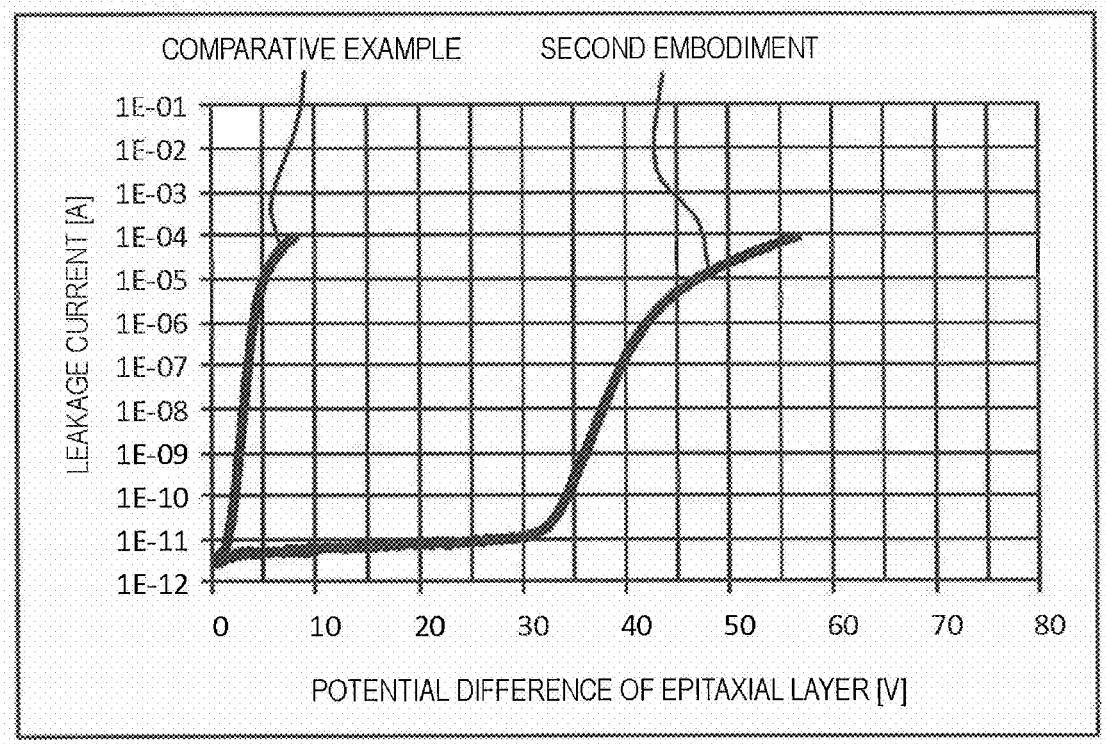

SEMICONDUCTOR DEVICE

This application is based on Japanese patent application No. 2012-272859, the content of which is incorporated hereinto by reference.

BACKGROUND

1. Technical Field

The present invention relates to a semiconductor device, and is a technology applicable to, for example, a semiconductor device including two circuits different from each other in a power supply voltage.

2. Related Art

Among semiconductor devices, there is one integrating a control circuit which generates a control signal of a power control element. In such a semiconductor device, a power supply voltage of the power control element is higher than a power supply voltage of the control circuit. Therefore, a second control circuit may be provided between the control circuit and the power control element to input the control signal to the power control element. Generally, a power supply voltage of the second control circuit is equal to or lower than the power supply voltage of the power control element and is higher than the power supply voltage of the control circuit. Therefore, it is necessary to generate the power supply voltage of the second control circuit separately from the power supply voltage of the control circuit. In addition, the control circuit and the second control circuit are connected through a connection element.

Examples of such semiconductor devices include those disclosed in Japanese Unexamined Patent Application Publication Nos. 2007-5823 and 2010-147181. For example, Japanese Unexamined Patent Application Publication No. 2007-5823 discloses a semiconductor device in which the control circuit and the second control circuit are connected by a high-withstand transistor. In addition, Japanese Unexamined Patent Application Publication No. 2010-147181 discloses that the periphery of the second control circuit is surrounded by an isolation region, and a transistor that connects the control circuit and the second control circuit is formed using the entire periphery of the isolation region.

SUMMARY

The present inventors have investigated provision of a transistor, which connects two circuits different in power supply potential, only at a part of an isolation region so as to transmit a control signal between circuits different in a power supply potential. In this case, the present inventors have found that when seen in a plan view, a portion of a field plate electrode which overlaps the transistor functions as a gate of a parasitic MOS transistor. In this case, a leakage current of the transistor is apt to increase.

Other problems and new characteristics will be apparent from description of the specification and the attached drawings.

In one embodiment, there is provided a semiconductor device including a first circuit, an isolation region, a second circuit, and a connection transistor. A power supply voltage of the first circuit is set to a first voltage, and a power supply voltage of the second circuit is set to a second voltage lower than the first voltage. The isolation region surrounds the first circuit except a part when seen in a plan view. The connection transistor is positioned at a portion of the circumference of the first circuit at which the isolation region is not provided and connects the second circuit to the first circuit. The isolation region includes an element isolation film and a field plate electrode. The field plate electrode overlaps the element isolation film and surrounds the first circuit when seen in a plan view and is positioned over the connection transistor. A source and a drain of the connection transistor are opposite to each other through the field plate electrode when seen a plan view. The field plate electrode is divided into a first portion including a portion positioned over the connection transistor, and a second portion other than the first portion.

According to the embodiment, in a transistor that connects a first circuit and a second circuit that are different in a power supply potential, a leakage current may be reduced.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 8 shows a view illustrating a cross-section along a line C-C' of FIG. 7; and FIG. 9 shows a view illustrating an electrical measurement result of a relationship between a potential difference between an epitaxial layer in a connection transistor and an epitaxial layer in an isolation region, and an amount of a current that flows between the two epitaxial layers.

DETAILED DESCRIPTION

Figure 1:
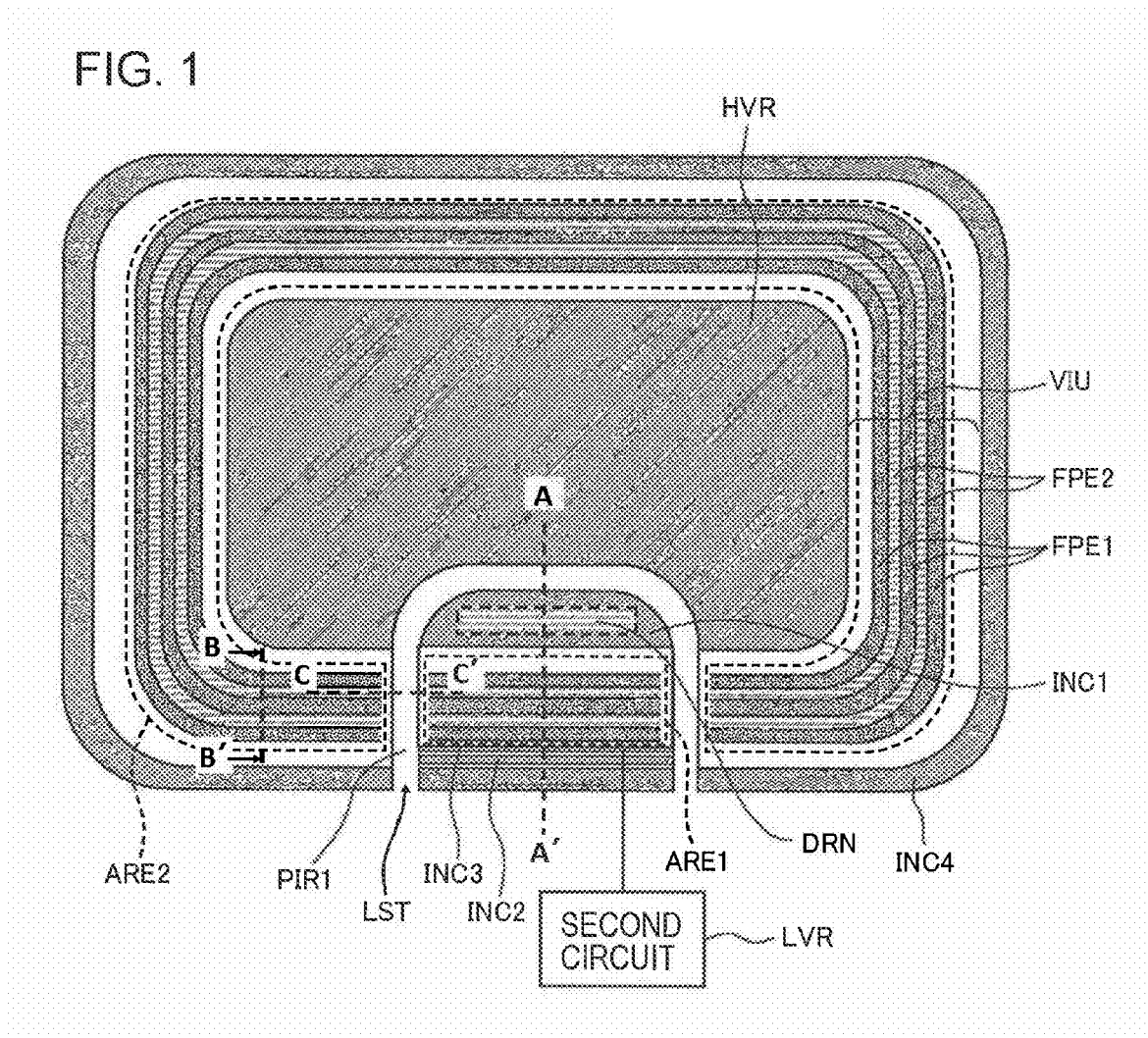
FIG. 1 shows a plan view illustrating a configuration of a semiconductor device according to a first embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes. In addition, in the drawings, the same reference numerals will be given to the same constituent elements, and description thereof will not be repeated.

First Embodiment

FIG. 1 shows a plan view illustrating a configuration of a semiconductor device SD according to a first embodiment. The semiconductor device SD includes a first circuit HVR, a second circuit LVR, an isolation region VIU, and a connection transistor LST. All of these are formed on the same substrate SUB (not shown in the drawing). In the first circuit HVR, a power supply potential is set to a first voltage. When seen in a plan view, the isolation region VIU surrounds the first circuit HVR except a part thereof. In the second circuit LVR, a power supply potential is set to a second voltage lower than the first voltage, and the second circuit LVR is positioned at an outer side of the isolation region VIU when seen in a plan view. Since the first circuit HVR and the second circuit LVR are different in the power supply potential, it is necessary to electrically isolate the first circuit HVR and the second circuit LVR. In the embodiment, the first circuit HVR and the second circuit LVR are electrically isolated by the isolation region VIU.

The connection transistor LST connects the second circuit LVR to the first circuit HVR. That is, the connection transistor LST is an element that absorbs the difference in a power supply potential between the first circuit HVR and the second circuit LVR. The connection transistor LST is positioned in the first circuit HVR at a region in which the isolation region VIU is not provided.

The semiconductor device SD may control a power control element which is connected to the outside, for example, a planar type high-withstand voltage MOS transistor, a vertical type MOS transistor, a bipolar transistor, or an insulated gate bipolar transistor (IGBT) by a signal output from the first circuit HVR. In addition, the power control element supplies power, for example, to a motor.

The second circuit LVR generates a control signal for controlling the power control element. The control signal is input to the power control element through the connection transistor LST and the first circuit HVR.

The isolation region VIU includes an element isolation film EI and a field plate electrode FPE. When seen in a plan view, the field plate electrode FPE overlaps the element isolation film EI and surrounds the first circuit HVR. In addition, a potential of the field plate electrode FPE is in a floating state. A part of the field plate electrode FPE is also positioned on the connection transistor LST. In addition, when seen in a plan view, a source (high-concentration N-type region SOU to be described later) and a drain (high-concentration N-type region DRN to be described later) of the connection transistor LST are opposite to each other through the field plate electrode FPE. In addition, the field plate electrode FPE is divided into a first portion ARE1 including a portion that is positioned on the connection transistor LST, and a second portion ARE2 other than the first portion ARE1. Hereinafter, description will be made in detail.

In the embodiment, a planar shape of the region in which the first circuit HVR is formed is an approximate rectangle. The connection transistor LST is disposed bridging over one side (for example, a long side) of the rectangle. In addition, when seen in a plan view, a boundary between the first portion ARE1 and the second portion ARE2 of the field plate electrode FPE is formed at a portion along one side of the connection transistor LST which is perpendicular to the field plate electrode FPE.

In addition, similar to like details to be described later, the field plate electrode FPE includes a first field plate electrode FPE1 that is formed on the element isolation film EI, and a second field plate electrode FPE2 that is formed on an insulating interlayer INSL. In addition, all of the first field plate electrode FPE1 and the second field plate electrode FPE2 surround the first circuit HVR in a multiple manner.

Figure 2:
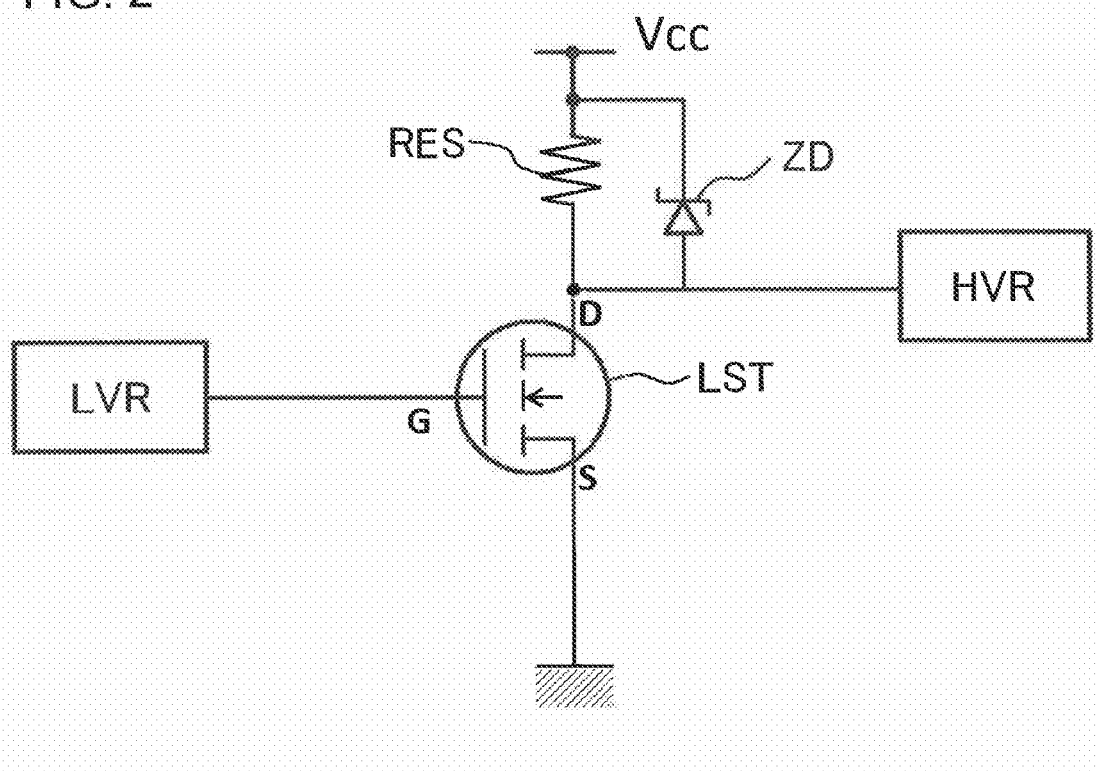
FIG. 2 shows a view illustrating a connection relationship of a signal line in the semiconductor device shown in FIG. 1.

FIG. 2 shows a view illustrating a connection relationship of a signal line in the semiconductor device SD shown in FIG. 1. The gate of the connection transistor LST is connected to the second circuit LVR. In addition, the source of the connection transistor LST is grounded, and the drain thereof is connected to the first circuit HVR. Further, the drain of the connection transistor LST is connected to a power supply interconnection of the second circuit LVR. A resistor RES and a zener diode ZD are connected in parallel between the power supply interconnection of the second circuit LVR and the drain of the connection transistor LST. When the connection transistor LST is turned ON/OFF, this circuit allows an amplitude having a magnitude Vcc, which corresponds to a power supply voltage in the first circuit HVR, to be generated in a drain voltage of the connection transistor LST. For example, when a potential difference between the second circuit LVR and the first circuit HVR is 800 V, and the power supply voltage of the first circuit HVR is 30 V, the drain voltage of the connection transistor LST fluctuates between 830 V to 800 V by inputting signals for turning ON/OFF the connection transistor LST from the second circuit LVR. According to this, the signals of the second circuit LVR may be transmitted to the first circuit HVR.

Figure 3:
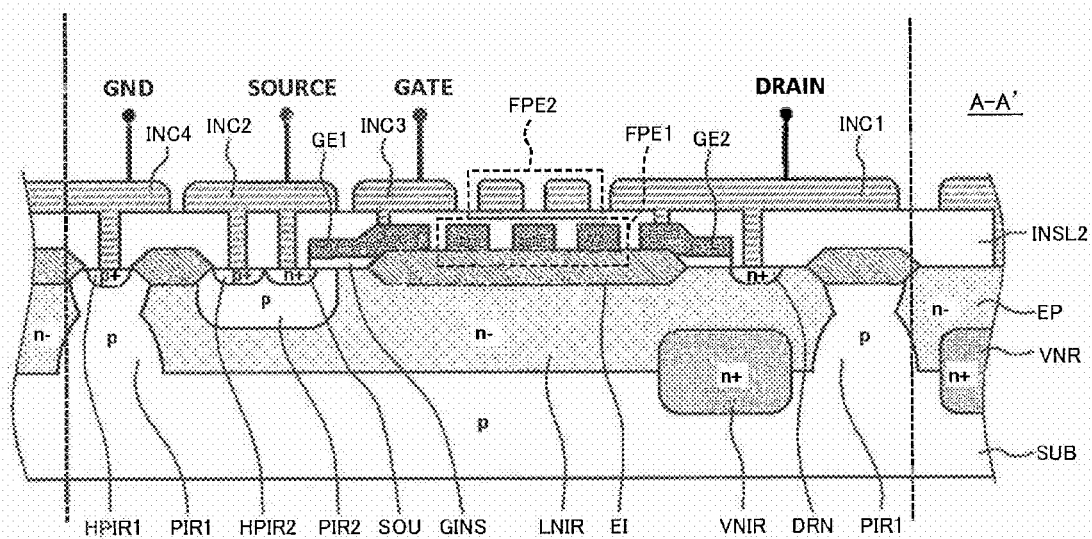
FIG. 3 shows a cross-sectional view taken along a line A-A' of FIG. 1.

FIG. 3 shows a cross-sectional view taken along a line A-A' of FIG. 1. In the embodiment, the semiconductor device SD is formed by using a p-type substrate SUB. An n-type epitaxial layer EP is formed on the substrate SUB, and the insulating interlayer INSL and an interconnection layer are formed on the epitaxial layer EP. A drain interconnection INC1, a source interconnection INC2, a gate interconnection INC3, a ground interconnection INC4, and the second field plate electrode FPE2 are provided in the interconnection layer.

The epitaxial layer EP is constituted by an n-type epitaxial layer, and a part of the n-type epitaxial layer EP becomes a low-concentration N-type region LNIR. In addition, a region of the epitaxial layer EP, which becomes the low-concentration N-type region LNIR, is surrounded by a P-type isolation region PIR1. In the P-type isolation region PIR1, the top surface reaches a surface of the epitaxial layer EP, and the bottom surface thereof reaches the substrate SUB. In addition, a high-concentration P-type region HPIR1 is formed at a part of the surface of the P-type isolation region PIR1. The high-concentration P-type region HPIR1 is connected to the ground interconnection INC4 through a contact.

In addition, in the P-type isolation region PIR1, a lower portion of a portion which comes into contact with the first circuit HVR is interposed between buried N layers VNIR. The buried N layers VNIR are regions in which a concentration of impurities is higher than that of the low-concentration N-type region LNIR, and are formed from a surface layer of the substrate SUB to a lower portion of the epitaxial layer EP when seen in a thickness direction.

In addition, the high-concentration N-type region DRN, a P-type region PIR2, the high-concentration N-type region SOU, and the high-concentration P-type region HPIR1 are formed in the epitaxial layer EP as a part of the connection transistor LST. The high-concentration N-type region DRN is formed at a part of a surface layer of the low-concentration N-type region LNIR and functions as the drain of the connection transistor LST. The high-concentration N-type region SOU is formed at a part of a surface layer of the P-type region PIR2 and functions as the source of the connection transistor LST. In the surface layer of the P-type region PIR2, a region positioned between the high-concentration N-type region SOU and the high-concentration N-type region DRN becomes a channel region of the connection transistor LST.

In addition, a gate insulating film GINS and a gate electrode GE1 of the connection transistor LST are formed on the channel region. Specifically, the element isolation film EI is formed between the high-concentration N-type region DRN and the P-type region PIR2. In addition, the gate insulating film GINS is formed over a region of the low-concentration N-type region LNIR between the P-type region PIR2 and the element isolation film EI and over the channel region. In addition, ends of the gate insulating film GINS and the element isolation film EI on a P-type region PIR2 side are covered with the gate electrode GE1.

In addition, an end of the element isolation film EI on a high-concentration N-type region DRN side is covered with an electrode GE2. The electrode GE2 is formed from the same material as the gate electrode GE1. In addition, a part of the electrode GE2 protrudes on the low-concentration N-type region LNIR, but an insulating film such as the gate insulating film GINS is formed below the protruding portion.

In addition, a high-concentration P-type region HPIR2 is formed at a part of the surface layer of the P-type region PIR2. Each of the high-concentration P-type region HPIR2 and the high-concentration N-type region SOU is connected to the source interconnection INC2 through a contact. In addition, the gate electrode GE1 is connected to the gate interconnection INC3 through a contact, and the high-concentration N-type region DRN and the electrode GE2 are connected to the drain interconnection INC1 through a contact.

In addition, the first field plate electrode FPE1 is formed on the element isolation film EI between the high-concentration N-type region DRN and the P-type region PIR2. In addition, the second field plate electrode FPE2 is formed on a portion of the insulating interlayer INSL which is positioned on the element isolation film EI. In addition, the second field plate electrode FPE2 is disposed between the gate interconnection INC3 and the drain interconnection INC1.

When seen in a plan view, all of a plurality of the first field plate electrodes FPE1 and the second field plate electrodes FPE2 are disposed to be spaced from each other. However, when seen in a plan view, each of the first field plate electrodes FPE1 is disposed to fill a gap between the second field plate electrodes FPE2, and each of the second field plate electrodes FPE2 is disposed to fill a gap between the first field plate electrodes FPE1. In addition, the first field plate electrode FPE1 and the second field plate electrode FPE2 overlap each other when seen in a plan view. Accordingly, when seen in a plan view, a gap is not present between the first field plate electrode FPE1 and the second field plate electrode FPE2. In this case, a buffering effect of a potential difference between both ends of the isolation region VIU due to the field plate electrode FPE increases.

Figure 4:
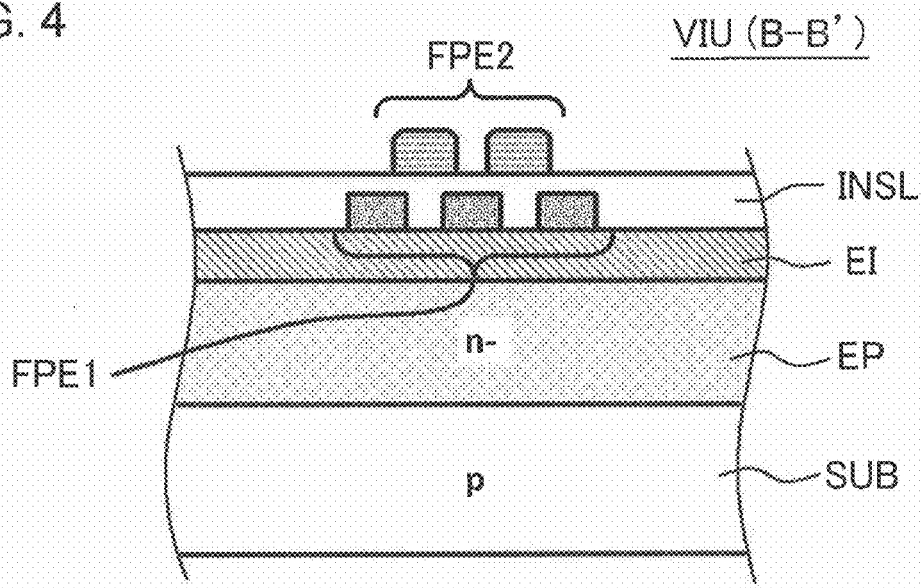
FIG. 4 shows a view illustrating a cross-section along a line B-B' of FIG. 1.

FIG. 4 shows a view illustrating a cross-section along a line B-B' of FIG. 1. The element isolation film EI is formed on the isolation region VIU. In addition, the first field plate electrode FPE1 and the second field plate electrode FPE2 are formed to overlap the element isolation film EI when seen in a plan view. All of the first field plate electrodes FPE1 and the second field plate electrodes FPE2 which are positioned in the isolation region VIU have the same configuration as portions of the first field plate electrode FPE1 and the second field plate electrode FPE2 which overlap the connection transistor LST.

In addition, all of the first field plate electrode FPE1 and the second field plate electrode FPE2 which are positioned in the isolation region VIU are larger in number by two than portions of the first field plate electrode FPE1 and the second field plate electrode FPE2 which overlap the connection transistor LST. In this case, when seen in a width direction, the isolation region VIU includes additional first field plate electrodes FPE1 at portions corresponding to the gate electrode GE1 and the electrode GE2 of the connection transistor LST, respectively. In addition, when seen in a width direction, the isolation region VIU includes additional second field plate electrodes FPE2 at portions corresponding to the drain interconnection INC1 and the gate interconnection INC3 of the connection transistor LST, respectively.

Figure 5:
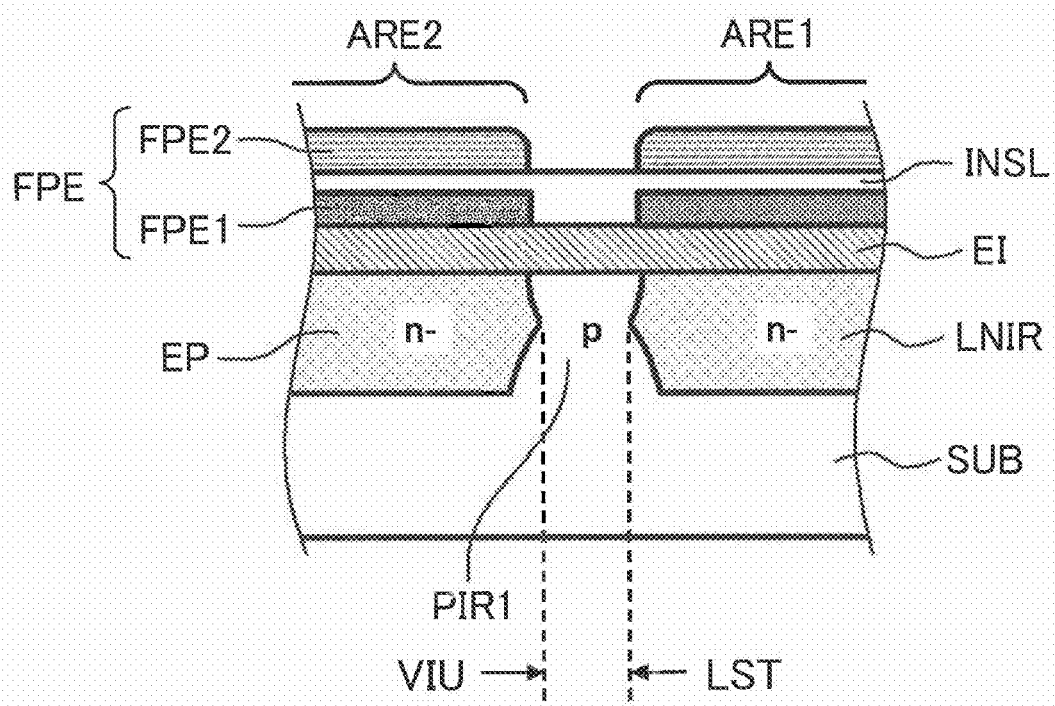
FIG. 5 shows a view illustrating a cross-section along a line C-C' of FIG. 1.

FIG. 5 shows a cross-section along a line C-C' of FIG. 1. In the embodiment, the boundary between the first portion ARE1 and the second portion ARE2 of the field plate electrode FPE is positioned over the P-type isolation region PIR1. An end of the second portion ARE2 may be positioned over the P-type isolation region PIR1, but it is preferable that the end do not cross the P-type isolation region PIR1 so as not to overlap the connection transistor LST.

Next, a manufacturing method of the embodiment will be described. First, n-type impurities are selectively implanted to the substrate SUB, and p-type impurities are selectively implanted to the substrate SUB. According to this, the buried N layer VNIR and a lower portion of the P-type isolation region PIR1 are formed. In addition, the buried N layer VNIR diffuses to a lower layer of the epitaxial layer EP by a heat treatment process (for example, a process of activating impurities) that is carried out in a process later than the implantation process.

Subsequently, the epitaxial layer EP is formed on the substrate SUB. Subsequently, p-type impurities are selectively implanted to the epitaxial layer EP. According to this, an upper portion of the P-type isolation region PIR1 and the P-type region PIR2 are formed.

Subsequently, the element isolation film EI and the gate insulating film GINS are formed on the epitaxial layer EP. Subsequently, a conductive film (for example, a polysilicon film) is formed on the element isolation film EI and the gate insulating film GINS, and the conductive film is selectively removed. According to this, the gate electrode GE1, the electrode GE2, and the first field plate electrode FPE1 are formed.

Subsequently, p-type impurities are selectively implanted to the epitaxial layer EP, and n-type impurities are selectively implanted to the epitaxial layer EP. According to this, the high-concentration P-type region HPIR1, the high-concentration P-type region HPIR2, the high-concentration N-type region SOU, and the high-concentration N-type region DRN are formed.

Subsequently, the insulating interlayer INSL is formed on the epitaxial layer EP and the element isolation film EI. Subsequently, a contact is buried in the insulating interlayer INSL, and the drain interconnection INC1, the source interconnection INC2, the gate interconnection INC3, the ground interconnection INC4, and the second field plate electrode FPE2 are formed on the insulating interlayer INSL. For example, these are formed from Al, but may be formed from other conductive materials.

Next, an operation and an effect of the embodiment will be described. According to the embodiment, the first circuit HVR is surrounded by the isolation region VIU. In addition, the isolation region VIU includes the field plate electrode FPE. Accordingly, even when the power supply potential of the first circuit HVR is high, the first circuit HVR and the second circuit LVR may be electrically isolated from each other.

In addition, the field plate electrode FPE is divided into the first portion ARE1 including a portion positioned on the connection transistor LST, and the second portion ARE2 other than the first portion ARE1. A potential of the field plate electrode FPE is a floating potential, and thus is determined by a capacity coupling with a potential of the epitaxial layer EP immediately below the field plate. Therefore, when the connection transistor LST operates, and a drain voltage of the LST decreases by the power supply voltage Vcc of the first circuit HVR, a potential difference between the epitaxial layer LNIR of the connection transistor LST and the epitaxial layer EP of the isolation region VIU occurs in an amount equivalent to Vcc. However, since the field plate electrode FPE is divided into the first portion ARE1 including a portion positioned on the connection transistor LST, and the second portion ARE2 other than the first portion ARE1, rising of the potential of the first portion ARE1 of the field plate electrode FPE may be suppressed. According to this, it is possible to suppress operation of a parasitic MOS transistor in which the first portion ARE1 of the field plate electrode FPE is set as a gate electrode.

This effect increases as a portion of the first portion ARE1 which protrudes from the connection transistor LST decreases. Therefore, as is the case with the embodiment, when the boundary between the first portion ARE1 and the second portion ARE2 is formed in a portion of the first circuit HVR along one side in which the connection transistor LST is provided, the above-described effect increases. In addition, when the boundary between the first portion ARE1 and the second portion ARE2 is positioned on a boundary between the connection transistor LST and the isolation region VIU, the effect further increases.

Figure 6:
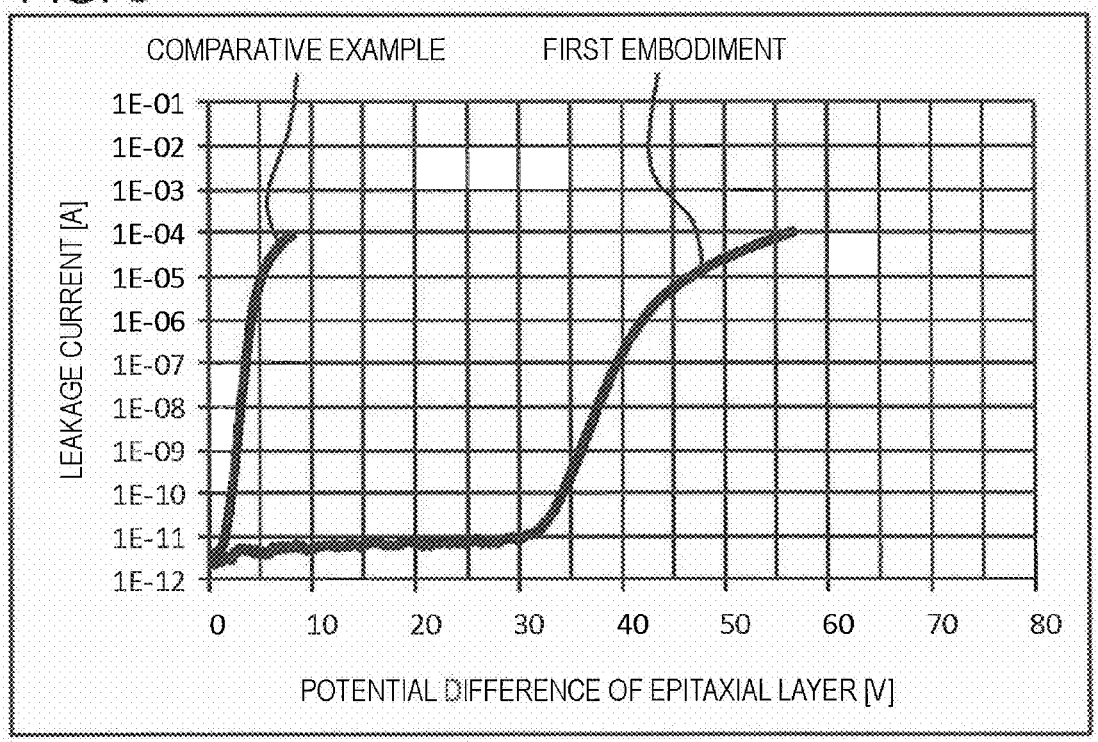
FIG. 6 shows a view illustrating an electrical measurement result of a relationship between a potential difference between an epitaxial layer in a connection transistor and an epitaxial layer in an isolation region, and an amount of a current that flows between the two epitaxial layers.

FIG. 6 shows a result, which is obtained by electrically measuring a relationship between a potential difference between the epitaxial layer EP (low-concentration N-type region LNIR) in the connection transistor LST and the epitaxial layer EP in the isolation region VIU, and an amount of a current that flows between the two epitaxial layers EP (that is, an amount of a leakage current) by using a practical device. As a comparative example, a semiconductor device in which division into the first portion ARE1 and the second portion ARE2 is not carried out is used. In addition, in this semiconductor device, a width of the P-type isolation region PIR1 is set to 5 μm, a gap between the first portion ARE1 and the second portion ARE2 in the first field plate electrode FPE1 is set to 10 μm, and a gap between the first portion ARE1 and the second portion ARE2 in the second field plate electrode FPE2 is set to 2 μm. From the drawing, when a structure of the embodiment is employed, the amount of a leakage current greatly decreases.

Second Embodiment

Figure 7:
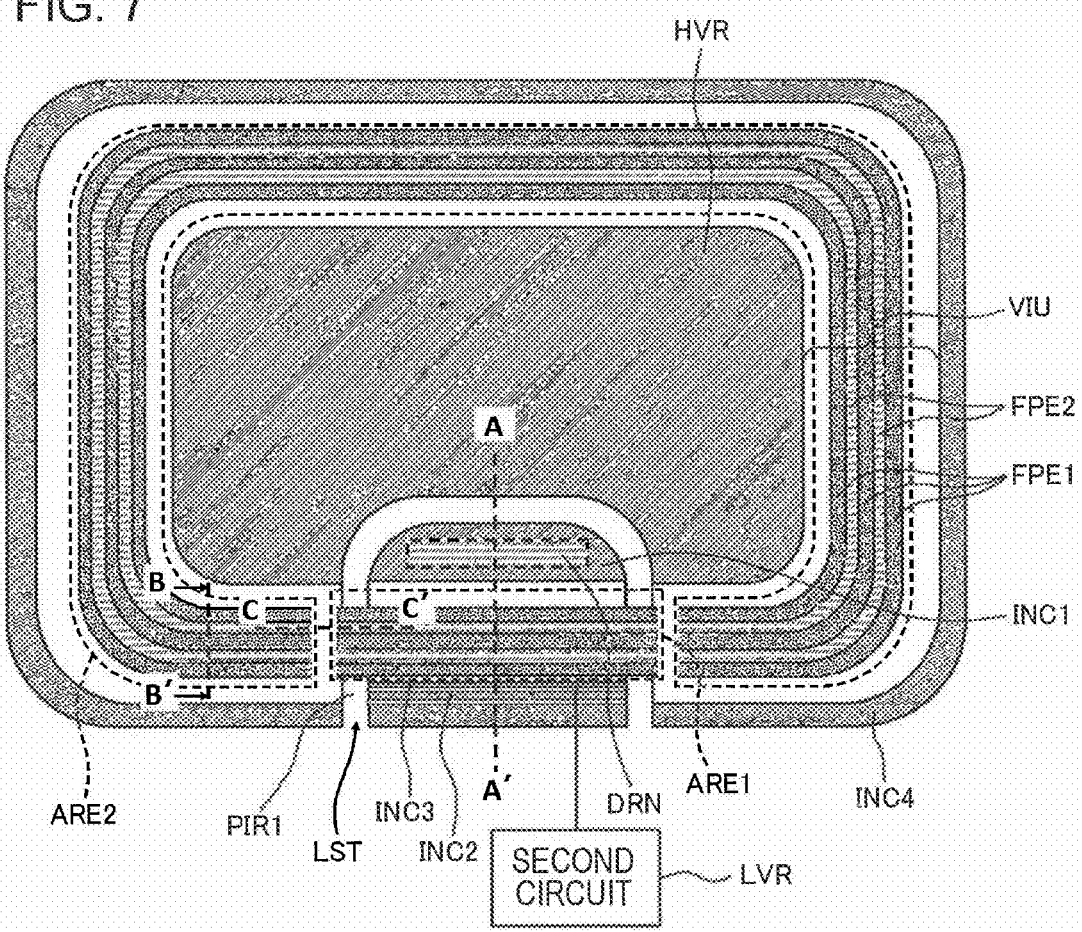
FIG. 7 shows a plan view illustrating a configuration of a semiconductor device according to a second embodiment.

FIG. 7 shows a plan view illustrating a configuration of a semiconductor device SD according to a second embodiment. FIG. 8 shows a view illustrating a cross-section along a line C-C' of FIG. 7. The semiconductor device SD according to the embodiment has the same configuration as the semiconductor device SD according to the first embodiment except that the boundary between the first portion ARE1 and the second portion ARE2 of the field plate electrode FPE is positioned over the isolation region VIU. Specifically, it is preferable that an end of the first portion ARE1 cover an upper side of the P-type isolation region PIR1 and the end do not cover the isolation region VIU so much.

FIG. 9 shows a relationship between a potential difference between the epitaxial layer EP (low-concentration N-type region LNIR) in the connection transistor LST and the epitaxial layer EP in the isolation region VIU, and an amount of a current that flows between the two epitaxial layers EP (that is, an amount of a leakage current) according to the embodiment. As a comparative example, a semiconductor device in which division into the first portion ARE1 and the second portion ARE2 is not carried out is used. Electrical measurement conditions are the same as FIG. 6. From the drawing, the amount of a leakage current also greatly decreases by the structure shown in the embodiment.

In addition, in the respective embodiments, the P-type semiconductor substrate is used as the substrate SUB, but substrate SUB may be an n-type semiconductor substrate. In this case, conduction types of the respective regions are reversed.

Hereinbefore, the invention made by the present inventors has been described in detail with reference to the embodiments of the invention, but it is apparent that the present invention is not limited to the above embodiments, and may be modified and changed without departing from the scope and spirit of the invention.

What is claimed is:
1. A semiconductor device, comprising:
a substrate;
a first circuit which is formed on the substrate and in which a power supply potential is set to a first voltage;
a second circuit in which a power supply potential is set to a second voltage lower than the first voltage and which is electrically isolated from the first circuit by an isolation region, the second circuit being formed on the substrate and positioned at an outer side of the isolation region when seen in a plan view; and
a connection transistor which is formed on the substrate and is positioned between the first circuit and the second circuit, and which connects the second circuit to the first circuit,
wherein the isolation region includes:
an element isolation film, and
a field plate electrode arrangement which overlaps the element isolation film and substantially surrounds the first circuit when seen in the plan view,
wherein a source and a drain of the connection transistor are opposite to each other through the field plate electrode when seen in the plan view,
wherein an insulating interlayer is formed over the element isolation film, and
wherein the field plate electrode arrangement includes a first portion positioned over the connection transistor, and a second portion not positioned over the connection transistor,
wherein the field plate electrode arrangement includes:
a first electrode formed over the element isolation film, and a second electrode formed over the insulating interlayer, and
wherein the first electrode and the second electrode are shifted from each other in the plan view.
2. The semiconductor device according to claim 1,
wherein the field plate electrode arrangement includes a plurality of first electrodes formed over the element isolation film and spaced from each other in the plan view, and a plurality of second electrodes formed over the insulating interlayer and spaced from each other in the plan view, and
wherein the first electrodes and the second electrodes are arranged alternately in the plan view.
3. The semiconductor device according to claim 2,
wherein the first electrodes and the second electrodes are arranged such that a respective gap between each pair of adjacent second electrodes is filled by one of the first electrodes in the plan view.
4. The semiconductor device according to claim 2,
wherein the first electrodes and the second electrodes are arranged such that a respective gap between each pair of adjacent first electrodes is filled by one of the second electrodes in the plan view.
5. The semiconductor device according to claim 3, wherein the first electrodes have a same configuration in the first and second portions of the field plate electrode arrangement, and
wherein the second electrodes have a same configuration in the first and second portions of the field plate electrode arrangement.

6. The semiconductor device according to claim 5, wherein the first field plate electrodes and the second field plate electrodes are electrically floating.

7. The semiconductor device according to claim 6,
wherein a plan shape of a region in which the first circuit is formed is substantially rectangular,
the connection transistor is disposed bridging over one side of the substantially rectangular region, and
a boundary region between the first portion and the second portion is formed in the field plate electrode arrangement at a portion which is perpendicular to the one side in the plan view.

8. The semiconductor device according to claim 7,
wherein the boundary region between the first portion and the second portion is positioned adjacent to the connection transistor in the plan view.

\* \* \* \* \*